United States Patent
Kruip et al.

(10) Patent No.: US 6,950,001 B2
(45) Date of Patent: Sep. 27, 2005

(54) SUPERCONDUCTING OPEN MRI MAGNET WITH TRANSVERSE MAGNETIC FIELD

(75) Inventors: Marcel Jan Marie Kruip, Oxford (GB); Paul Beasley, Abingdon (GB)

(73) Assignee: Oxford Magnet Technology Limited, Oxfordshire (GB)

( * ) Notice: Subject to any disclaimer, the term of this patent is extended or adjusted under 35 U.S.C. 154(b) by 0 days.

(21) Appl. No.: 10/470,922

(22) PCT Filed: Feb. 1, 2002

(86) PCT No.: PCT/EP02/01238

§ 371 (c)(1),
(2), (4) Date: Dec. 30, 2003

(87) PCT Pub. No.: WO02/065149

PCT Pub. Date: Aug. 22, 2002

(65) Prior Publication Data

US 2004/0085170 A1 May 6, 2004

(30) Foreign Application Priority Data

Feb. 2, 2001 (GB) .............................. 0102654

(51) Int. Cl.⁷ ................................................ H01F 5/00
(52) U.S. Cl. ...................... 335/296; 335/299; 335/216
(58) Field of Search .................. 335/216, 296, 335/299, 300–306; 324/318–322

(56) References Cited

U.S. PATENT DOCUMENTS

| | | | |
|---|---|---|---|
| 3,034,039 A | 5/1962 | Günthard et al. | |
| 4,339,718 A | 7/1982 | Bull et al. | |
| 4,779,070 A | * 10/1988 | Hackworth et al. | 335/296 |
| 5,448,214 A | * 9/1995 | Laskaris | 335/301 |
| 5,936,498 A | * 8/1999 | Takeshima et al. | 335/216 |
| 6,613,240 B2 | 9/2003 | Skinner et al. | |

FOREIGN PATENT DOCUMENTS

| | | |
|---|---|---|
| EP | 1 063 533 A2 | 12/2000 |
| JP | 60139923 | 7/1987 |

* cited by examiner

Primary Examiner—Lincoln Donovan
(74) Attorney, Agent, or Firm—Crowell & Moring LLP (57) ABSTRACT

The present invention relates to magnets and to magnetic resonance imaging systems. The magnet is open with magnetic coils arranged in quadrant, separated about two perpendicular planes, a midplane and a plane of reflection, and wherein the windings are configured such that, in operation, current flow is symmetrical about the plane of reflection and anti-symmetrical about the midplane, to produce a nett magnetic field at the center in a direction perpendicular to the plane of reflection.

14 Claims, 9 Drawing Sheets

SUPERCONDUCTING OPEN MRI MAGNET WITH TRANSVERSE MAGNETIC FIELD

FIELD OF THE INVENTION

The present invention relates to magnets and, in particular but not necessarily so restricted, relates to magnets for magnetic resonance imaging equipment, especially to magnets which are open, i.e. magnets in which an imaging volume, wherein that portion of a patient being imaged is positioned, is not surrounded by the magnet.

BACKGROUND OF THE INVENTION

A special requirement for MRI is a strong uniform magnetic field, typically 0.2 to 2 Tesla, with a field homogeneity of a few parts per million in the imaging volume, typically a sphere of 30 cm to 50 cm in diameter. Most commonly such a field is produced by an electromagnet having a solenoid construction but this necessitates a patient being surrounded by the magnet and enclosed within a central bore tube. Although the length of this bore tube is typically 1.6 m or less it can cause a feeling of claustrophobia which is extremely distressing to some patients. Furthermore, such a design does not give any access to the patient, which may be essential for interventional procedures, or when the proximity of a companion is required to put the patient at ease. However by using open magnets, these problems are overcome, or at least substantially mitigated.

Open electromagnets for use in MRI systems are well known. One form of an open electromagnet, often described as a 'split pair' comprises a pair of juxtaposed sets of coils, which are generally of a solenoid construction and may include a bore tube around the axis. The sets of coils are held apart by a support structure with a gap between the assemblies wide enough for a person to stand, so that access may be gained to the imaging volume between them along any of the principal axes of the system. Normally, the patient would be positioned along the axis of the solenoids. The gap between the solenoid assemblies is adequate for access to do interventional work. Such a system is described in U.S. Pat. No. 5,381,122 and in a paper by Laskaris et al, entitled 'A Cryogen-Free Open Superconducting Magnet for Interventional MRI Applications' published in IEEE Transactions in Applied Superconductivity, Volume 5, No. 2, June 1995.

Another solution is a design wherein two sets of solenoidal coils are concentric with a vertical axis. Such a design is described in, for instance, U.S. Pat. No. 5,874,882. However, the disadvantage of such a design is that for a given central field strength, a large stray field is produced. The size of the stray field can be reduced by increasing the size of the so-called shielding coil. However, an increase of the size of the shielding coils will reduce the central field. This reduction, in turn, requires a substantial increase in the size of the driving coils. The result is that a magnet, comprising concentric axial coils, spaced apart to allow good access to the patient, will require a substantial amount of conductor for a given central field to keep the stray field to a reasonable size.

In Huson et al, PCT WO93/15514, an electromagnet is disclosed which comprises a pair of juxtaposed magnetic poles of opposite polarity between which the imaging volume is defined, which poles are linked and supported by an iron yoke or superconducting solenoid which provide a magnetic flux return path. The iron yoke principally comprises a generally C-shaped iron frame. Because large amounts of iron are required, these known C-shaped magnets are very heavy, especially for high field magnets which require many tonnes of iron to define the flux return path. Huson et al further discloses the use of shielding coils for constraining the magnetic return flux but the amount of conductor used, and hence the cost, is high.

In each of these known open magnets the direction of the magnetic field is along the axis of the coils, and therefore perpendicular to the plane of the gap. The magnetic force between the juxtaposed magnetic poles of these known open magnets is very large, and acts in a direction to close the gap. This imposes large compressive forces on a structure used to support the poles, and requires that the structure has adequate strength and stability to resist the forces. The structure must therefore be substantial, and provides a significant impediment to free access to the imaging volume,

OBJECT OF THE INVENTION

The present invention seeks to provide an improved magnet. The present invention further seeks to provide a magnet suitable for magnetic resonance imaging.

The present invention also seeks to provide a magnet configuration such that access to the patient is not impeded, whilst a strong field with good homogeneity is provided. The present invention also seeks to provide a magnet configuration which has a small stray field with a reduced requirement for conductor in the construction of magnetic coils.

STATEMENT OF THE INVENTION

In accordance with a first aspect of the invention, there is provided a magnet assembly comprising a plurality of magnetic coils comprising windings of electrically conductive material; wherein the magnetic coils are arranged in quadrants, separated about two perpendicular planes, a midplane and a plane of reflection, and wherein the windings are configured such that, in operation, current flow is symmetrical about the plane of reflection and anti-symmetrical about the midplane to produce a net magnetic field at a centre of the assembly in a direction perpendicular to the plane of reflection.

The magnetic coils may comprise nested sub-coils, overlapping sub-coils or interleaved sub coils. The magnetic coils may consist of sub-coils being in different planes. The magnetic coils may comprise D coils, banana coils (as known to those skilled in the art), or coils of other types. The magnet coils may also be configured as D coils or banana coils which are nested or overlapping with other coils.

Conveniently the magnet coils comprise electrically conducting materials such as copper or aluminum. Preferably the magnet coils comprise superconducting materials, which may be low temperature superconductors or high temperature superconductors, as is known. The magnetic field produced will be greater than 0.1T: typically fields of greater than 1T will be employed in apparatus such as a magnetic resonance imaging apparatus.

The magnet coils can therefore comprise substantially identical coil subassemblies for each quadrant of the magnet assembly thereby simplifying the manufacture of the magnet assembly. In the simplest form of the invention, there would be four coil subassemblies.

In accordance with another aspect of the invention there is provided a magnetic resonance imaging system comprising a primary magnet assembly, a cryostat unit, a RF assembly and a gradient magnet assembly, wherein the primary magnet assembly comprises windings of electrical conductive material. The magnetic coils are arranged in quadrants, separated about two perpendicular planes, a midplane and a plane of reflection, and the windings are configured such that, in operation, current flow is symmetrical about the plane of reflection and anti-symmetrical about the midplane to produce a magnetic field at the center in a direction perpendicular to the plane of reflection. The primary magnet is situated within the cryostat to provide an operating temperature at which super conductivity of the coils will occur wherein the gradient magnets are operable to provide magnetic fields across predetermined planes, so as to enable magnetic resonance imaging.

In this aspect of the invention, arrangement of conductors results in a less claustrophobic imaging system than a conventional solenoid coil magnet arrangement.

A central part or corresponding parts to the cryostat, facing inwardly and centrally around a patient body part of interest can conveniently be recessed to allow space for a gradient coil and an RF coil. Such space could also be conveniently be employed for the positioning of shims for the primary magnet.

In accordance with a further aspect of the invention, there is provided a method of operating a magnet assembly within a cryostat, the magnet assembly comprising: a plurality of magnetic coils having windings of electrically conductive material, the magnetic coils being arranged in quadrants separated about two perpendicular planes (a midplane and a plane of reflection). The method comprises the steps of: cooling the magnet assembly to a temperature at which super conductivity is possible, and flowing current in the magnetic coils, such that the direction of current flow is symmetrical about the plane of reflection and anti-symmetrical about the midplane.

Thus in one aspect the present invention provides a magnet suitable for a magnet resonance imaging apparatus which provides a strong magnetic field of high homogeneity and a small stray field, with a low requirement for conductor. In magnets where this conductor consists of a superconductor, such as NbTi, this reduction in amount of conductor will lead to a substantial saving in weight and cost.

BRIEF DESCRIPTION OF THE FIGURES

For a better understanding of the invention and to show how the same may be carried into effect, there will now be described by way of example only, specific embodiments, methods and processes according to the present invention with reference to the accompanying Figures, as shown in the accompanying drawing sheets, wherein.

DETAILED DESCRIPTION OF INVENTION

There will now be described by way of example the best mode contemplated by the inventor for carrying out the invention. In the following description numerous specific details are set forth in order to provide a thorough understanding of the present invention. It will be apparent, however, to one skilled in the art, that the present invention may be practised without using these specific details. In other instances, well known methods and structures have not been described in detail so as not to obscure the present invention unnecessarily. For example, whilst the figures show the patient access plane or midplane to be in the horizontal plane, it is also possible to have the patient access plane vertically oriented.

Figure 1:
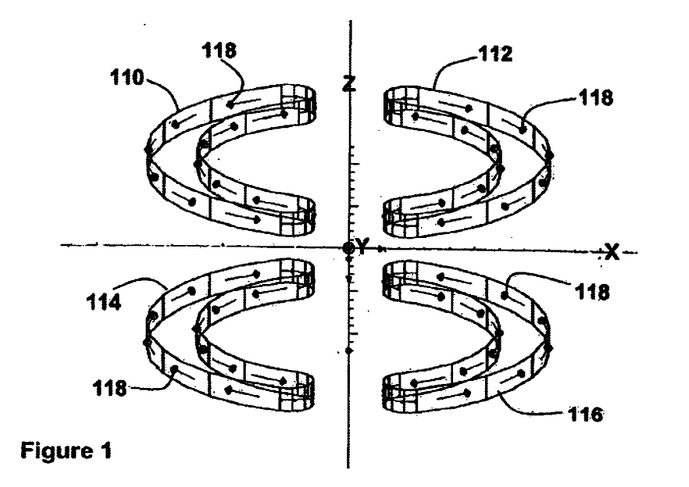
FIG. 1 shows a perspective view of an arrangement of four magnet coils in accordance with a first aspect of the invention.

FIG. 1 shows an arrangement consisting of four coils 110, 112, 114, 116 and a XYZ coordinate reference frame, which will be referred to in the following description. The coils 110–116 shown in FIG. 1 are symmetrically arranged with respect to the X-Y plane, which is also identified as the midplane, and also to the Y-Z plane which is identified as the plane of reflection. The coils have a plane of symmetry with respect to the Z-X plane. The arrows 118 on the coils are shown to demonstrate the direction of the current with respect to each other. The currents of the coil 110, which lies above the midplane (X-Y plane), are opposite (anti-symmetrical) to the currents of the coil 114, which lies below the midplane. Further the sense of rotation of the currents of the coils 112, 116 in the positive X space is opposite to the sense of the currents of the coils 110, 114 in the negative X space. The shape of each coil shown in FIG. 1, sometimes referred to as a 'banana coil' is not straight-forward to manufacture by a conventional winding process because of the reversed radius of curvature on the side of the coil closest to the plane of reflection.

Figure 2:
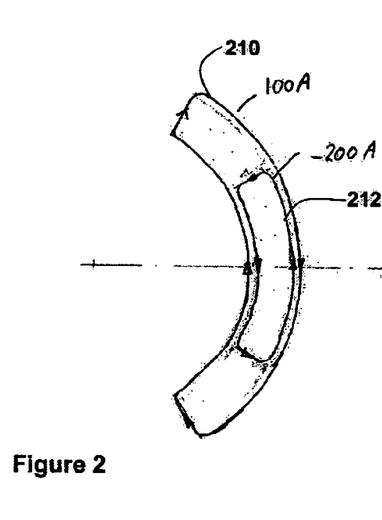
FIGS. 2 and 3 show a comparison of two banana coil configurations.
Figure 3:
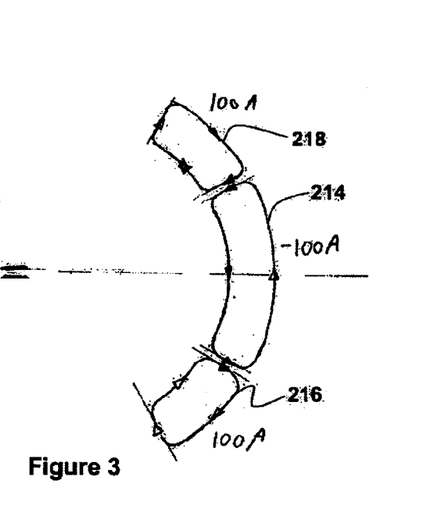

FIGS. 2 and 3 show two configurations of banana coils, but the magnetic field produced by each is the same. FIG. 2 is a nested banana coil wherein a 120° arc banana coil 210 carrying a current of 100 A in a first direction has a 60° arc banana coil 212 nested within. The 60° coil carries a current of 200 A in a direction opposite to the first direction resulting in an overall current of 100 A in the second direction for the centre 60° arc of the whole 120° arc configuration. This is equivalent to the structure shown in FIG. 3 wherein there is a central 60° arc banana coil 214 carrying 100 A current in the second direction with two peripheral 30° arc banana coils 216, 218 carrying 100 A current in the first direction.

Figure 4:
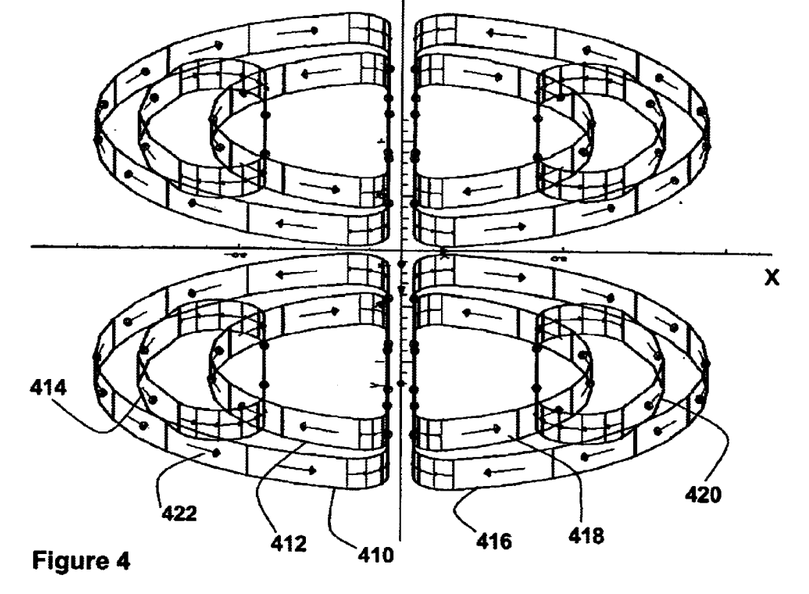
FIG. 4 shows a perspective view of an arrangement of four magnet coil assemblies in accordance with another aspect of the invention.

Although methods of manufacture for such banana coils are well known it may be easier to produce substantially the same magnetic field by superimposing D-shaped coils as shown in FIG. 4. This also gives an additional degree of freedom in positioning the straight sides of the D's whereby to help improve the homogeneity of the field. The D shape coils can be interleaved and/or over lapping. Referring to the lower coils, it can be seen that coils 410, 412 and 414 have mirror image coils in 416, 418, 420 both in shape and respective current directions, since FIG. 4 also shows the directions of the currents 422 in each of the D-shaped coils. Each D-shaped coil is wound around an axis which is aligned parallel to the Z-axis in operation. Although the coil is non-circular, the winding is straightforward since there is no reversal in the radius of curvature of the winding. Whilst a D-shape is conventionally expected to have a straight section on one side, in practice, the side need not be completely straight but may merely have an extremely large radius, to assist in the winding of the wire. For similar reasons, the corners at the ends of the straight section are preferably rounded, rather than comprise a sharp corner. In this way a generally D-shaped coil can be readily wound using a conventional wire-winding process but with a variable radius of curvature rather than the fixed radius used for circular coils. Although the axis of winding of each of the individual coils is parallel to the Z axis, the arrangement of the currents in the different coils produces a resultant field at the centre of the system which is perpendicular to the Z axis. Similarly, in the region external to the system the fields of the individual coils serve to cancel each other out, resulting in a very low stray field external to the system without the need for additional shielding measures such as extra coils.

Figure 5:
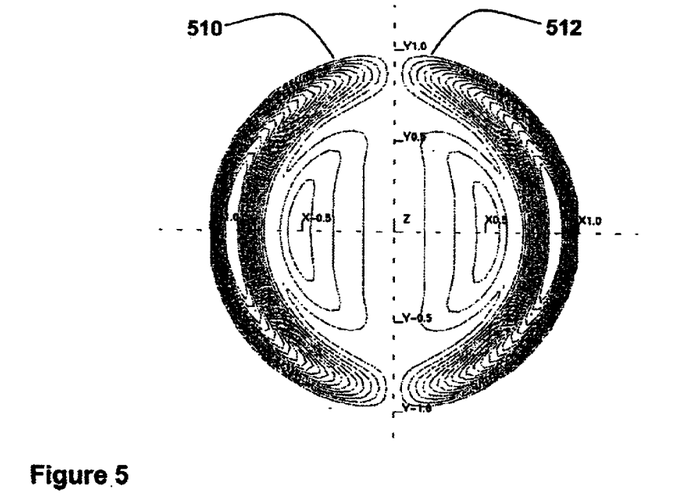
FIG. 5 shows a sectional view of an arrangement through conductors in accordance with a further aspect of the invention.

FIG. 5 shows the top view of a set of planar coils which will produce a homogeneity which has a predicted peak-peak value of 6 ppm on a sphere of 40 cm. Coils 510 and 512 are identical with current directions (not shown) being mirror images in the X=0 plane. These coils are similar in construction to plane or gradient coils, as are known. In contrast to gradient coils, which are configured to provide zero field at the centre of a complete MRI system, the current connection differs in that the coils of each quadrant are connected in series whereby to provide in operation, a high homogeneous field at the centre of an MRI system.

Figure 6:
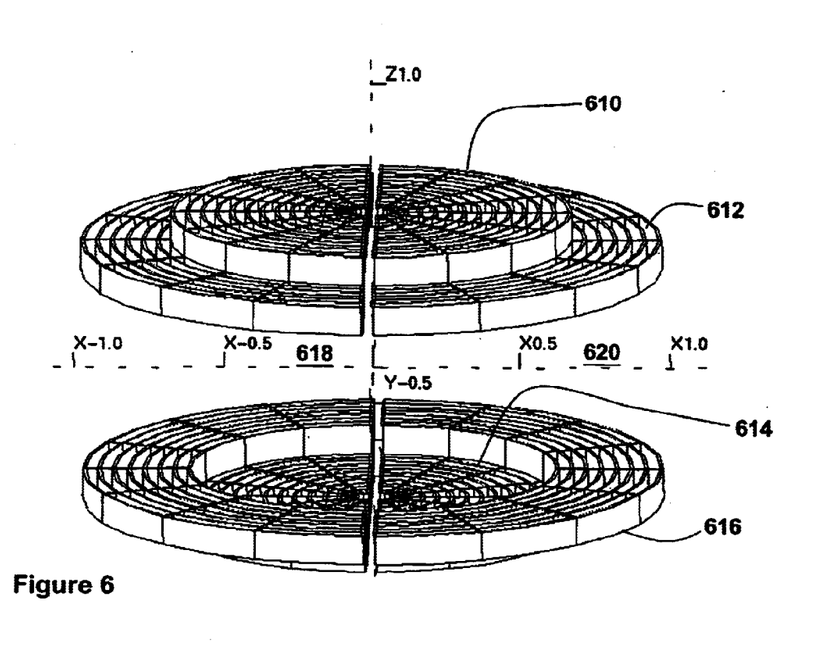
FIG. 6 shows a perspective view of a set of sector shaped coils, with a recess.

FIG. 6 shows a rendered view of an arrangement of conductors 610, 612, 614, 616 in a polar grid fashion. The central gap 618 between the central conductors 610, 614 provides sufficient space for RF coils a gradient coil and shims, whilst the gap 620 between the outercoils 612, 616 is less. This improves the homogeneity of the field and reduces the amount of conductor required to generate a given central field. For computational purposes, the coils are shown as being segmented, but this does not accurately reflect their actual contruction.

Figure 7:
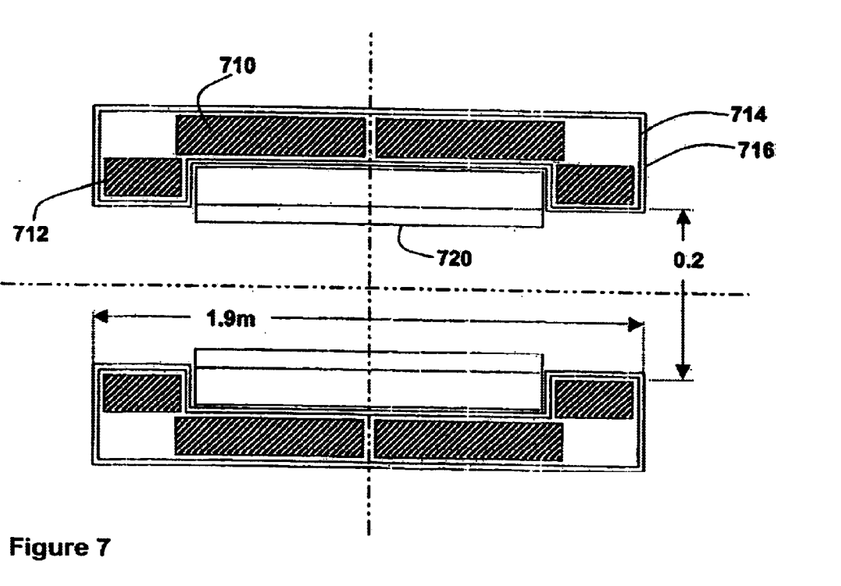
FIG. 7 shows a cross section in the XZ plane, of one embodiment of the invention showing the arrangement of the coils with respect to other components of the MRI system.

FIG. 7 shows a cross section in the ZX plane of an MRI scanner with an arrangement of conductors similar to that shown in FIG. 6. The conductors are arranged in two groups, 710 and 712. Group 710 corresponds to the conductors with the increased gap. The conductors will operate in a superconducting fashion, as is known. The outer portion of conductors is identified as 712. Present superconductors require operation at a low temperature and the conductors in this example are surrounded by an enclosure, 714, which acts as thermal radiation shield. In addition, this enclosure can also be used to contain a cryogen. The conductors 710 and 712 and the enclosure, 714, are surrounded by an airtight enclosure 716. The inside of this enclosure is evacuated, to minimise the conduction of heat from the inside surface of enclosure 716 to the conductors through convection. The enclosure 720 has a part which contains a gradient coil assembly, and a RE coil, (both not shown). The central field has been calculated to be 1 T for a 35 mega-amp-meter conductor with a homogeneity of 143 ppm over a 40 cm diameter sphere. The outside diameter of the conductors is 1.9 m, with a gap between conductors of 0.7 m, with a gap between inner conductors of 0.9 m.

Figure 8:
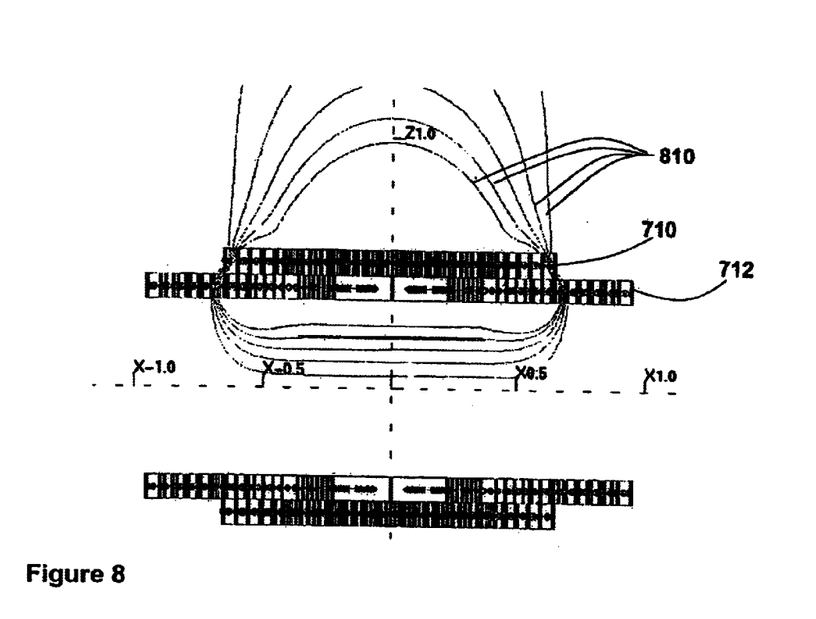
FIG. 8 shows the direction of the magnetic field in the XZ plane for the arrangement of coils shown in FIG. 7.
Figure 8A:
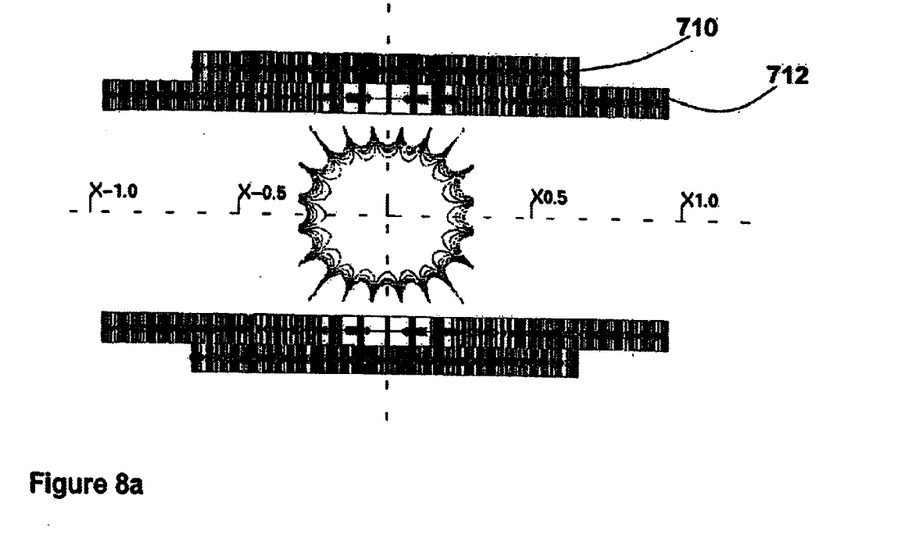
Figure 8B:
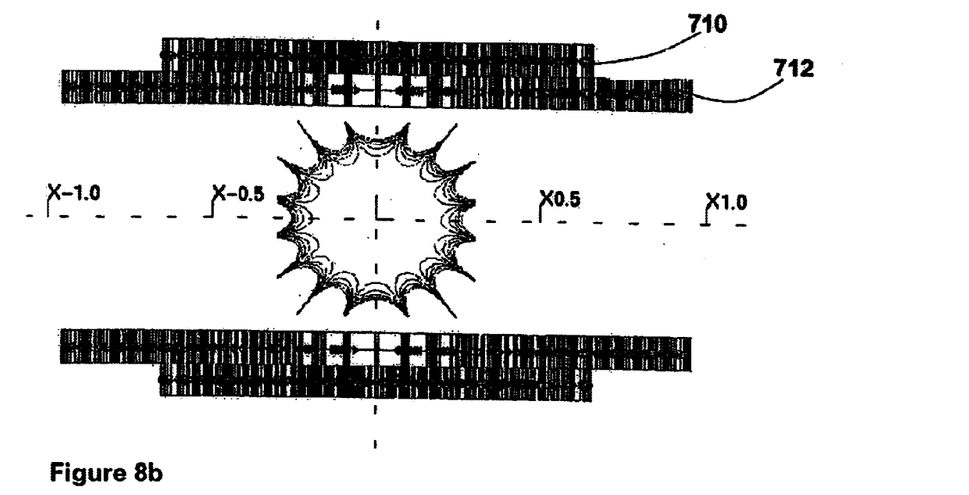
Figure 8C:
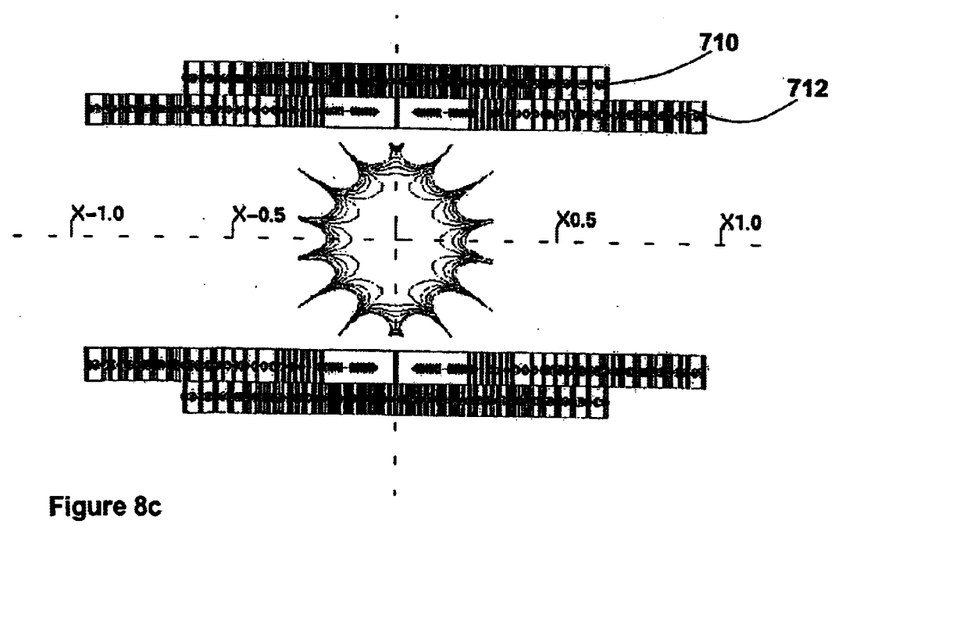

FIG. 8 shows lines of flux 810 in the X-Z (y=0) plane for the embodiment depicted in FIG. 7. The lines, whilst not showing field strength, do show the highly desirable parallel field produced by the present invention (for magnetic resonance imaging Purposes). FIGS. 8a through 8c show, respectively lines of constant magnetic field describing |B| in the X-Z (y=0) plane, y=0.1 m plane and y=0.2m plane. The present invention therefore conveniently provides an embodiment which enables a 0.2 radius diagnostic volume to be achieved.

Figure 9:
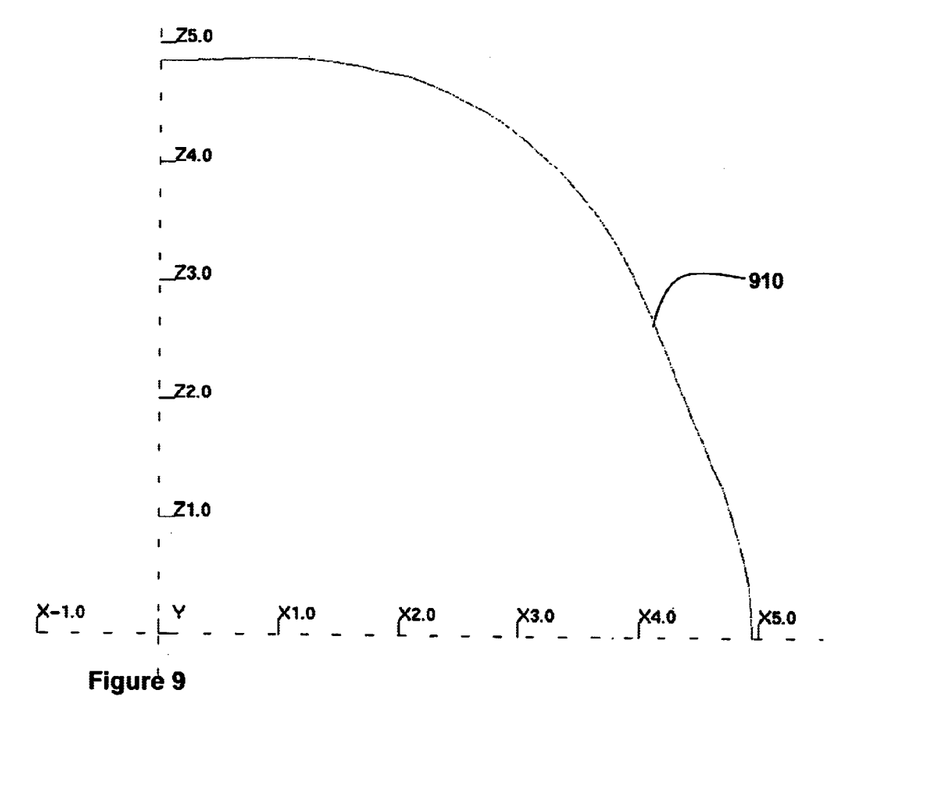
FIG. 9 shows the 5 Gauss line in the XZ plane of the system according to FIG. 7.

FIG. 9 shows the 5 Gauss plot line 910 computed for the conductor assembly as described in FIG. 7, in the ZX plane. Only the 5 Gauss line in the +X +Y quadrant is shown. This clearly demonstrates the low stray field characteristics of the present invention.

Figure 10:
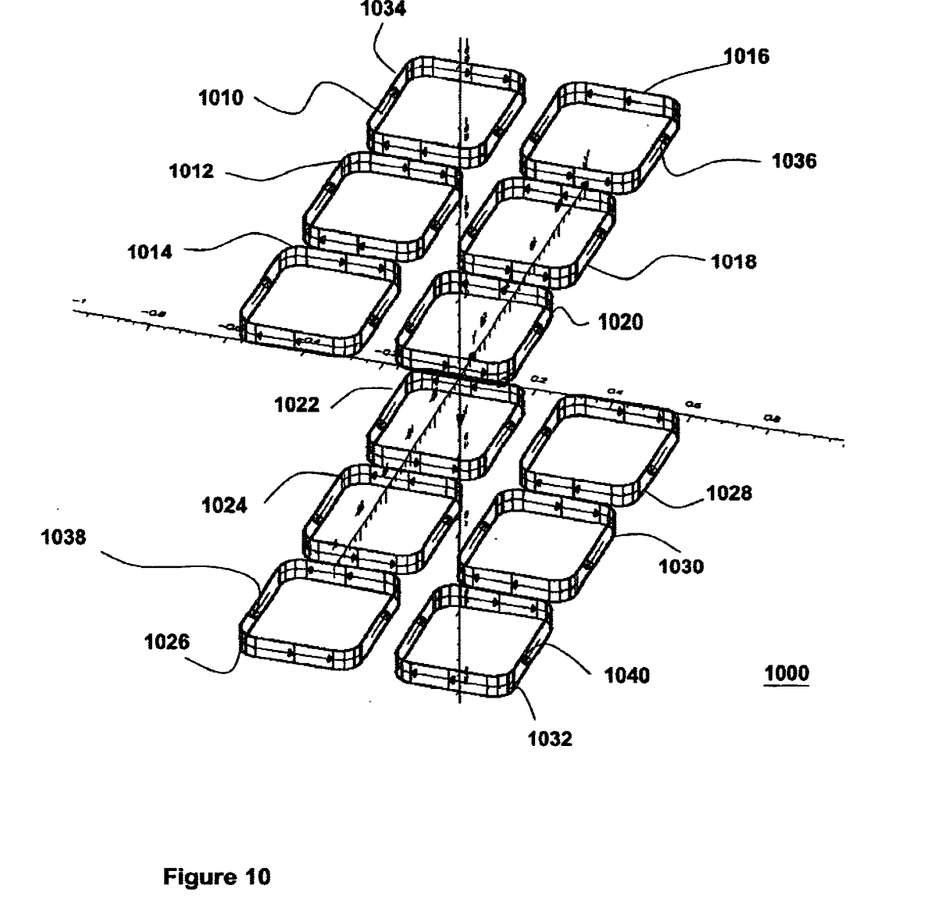
FIGS. 10, 11 and 12 show alternative embodiments.
Figure 11:
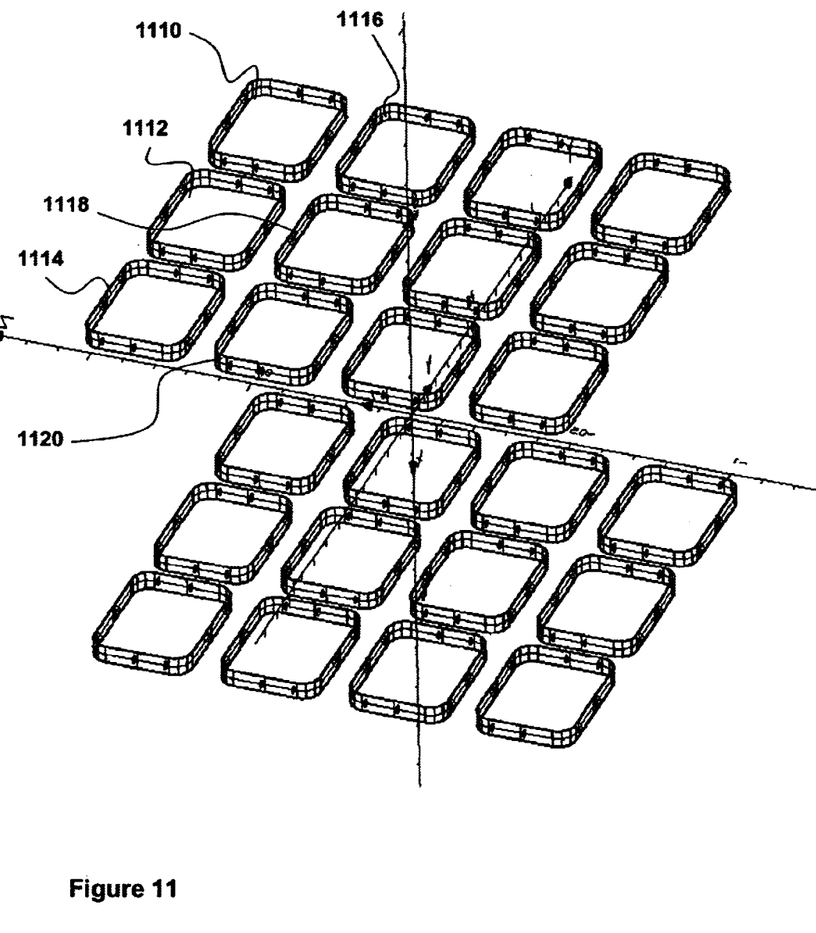
Figure 12:
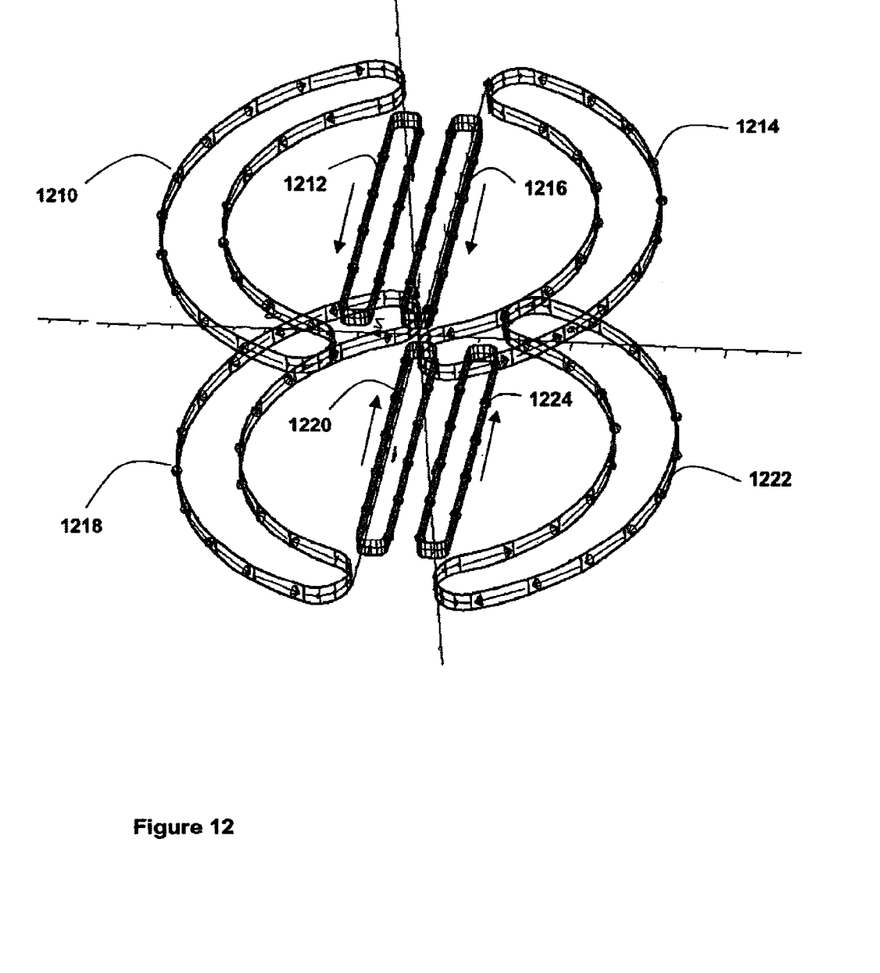

FIG. 10 shows, in perspective view all the primary magnets of one embodiment 1000. Each quadrant comprises three coils 1010, 1012, 1014 . . . 1032 in side-by-side relationship, with the central coil lying in the y=0 plane. The current flow directions 1034–1040 in each coil of a quadrant is the same, FIG. 11 shows a similar arrangement to FIG. 10, except that there are six coils 1110–1120 in each quadrant. It will be appreciated that it may be desirable to have a broad imaging area for certain applications. Alternatively, the use of a number of small, sub-coils may enable manufacturing costs to be reduced. FIG. 12 corresponds with FIG. 1, except that each banana coil 1210, 1214, 1218, 1222 is provided with a supplementary rectangular coils 1212, 1216, 1220, 1224 situated on the inside arc of the banana, with the current direction of the respective coils of the quadrant being opposite.

A new configuration for the placement of magnetic coils suitable for a magnetic resonance imaging assembly has been described. Advantages arising from the design are numerous: high levels of patient access are afforded by way of the open design; since the nett magnetic field is generated perpendicular to the configuration, the magnetic forces of attraction between opposing coils either side of the imaging volume are reduced allowing the construction of the supports between the coil groups to be less substantial than is known for conventional open- or C-magnets; patients may be aligned head-to-toe along the magnetic field of at any angle thereto; the use of smaller magnets with a concomitant reduction in the amount of conductor wire can achieve useful savings in manufacturing costs.

What is claimed is:

1. A magnet assembly comprising four sets of magnetic coils, each set of coils comprising windings of electrical conductive material; wherein:

the sets of magnetic coils are arranged in quadrants, separated about two mutually perpendicular planes, including a midplane and a plane of reflection;

the sets of coils are also symmetrical about a third plane that is perpendicular to both the midplane and the plane of reflection, such that the three planes are mutually orthogonal;

each of the coils is wound around an axis that is perpendicular to the midplane; and the windings are configured such that, in operation, current flow in said coils is symmetrical about the plane of reflection and anti-symmetrical about the midplane, whereby a resultant net magnetic field is produced at a center of the assembly in a direction perpendicular to the plane of reflection.

2. A magnet according to claim 1, where the magnetic coils comprise D coils.

3. A magnet according to claim 1, wherein the magnet coils comprise banana coils.

4. A magnet according to claim 1, wherein the magnet coils comprise sub-coils.

5. A magnet according to claim 4, wherein the sub-coils are provided in a nested and/or overlapping arrangement.

6. A magnet according to claim 1, wherein the coils are non-planar.

7. A magnet according to claim 1, adapted for us in a magnetic resonance imaging system.

8. A magnetic resonance imaging system comprising:
   a primary magnet assembly;
   a cryostat unit; and
   a gradient magnet assembly; wherein,
   the primary magnet assembly comprises windings of electrical conductive material arranged in sets of coils;
   the sets of coils are arranged in quadrants, separated about two mutually perpendicular planes, including a midplane and a plane of reflection;
   the sets of coils are also symmetrical about a third plane that is perpendicular to both the midplane and the plane of reflection, such that the three planes are mutually orthogonal;
   each of the coils is wound around an axis that is perpendicular to the midplane;
   the windings are configured such that, in operation, current flow in said coils is symmetrical about the plane of reflection and anti-symmetrical about the midplane;
   the primary magnet is situated within the cryostat to provide an operating temperature at which superconductivity is possible; and
   the gradient magnets are operable to provide magnetic fields across predetermined planes to enable magnetic resonance imaging.

9. A system according to claim 8, where the magnetic coils comprise D coils.

10. A system according to claim 8, wherein the magnet coils comprise banana coils.

11. A system according to claim 1, wherein there are sub-coils.

12. A system according to claim 11, wherein the sub-coils are provided in a nested and for overlapping arrangement.

13. A system according to claim 8, wherein the coils are non-planar.

14. A method of operating a magnet assembly within a cryostat, the magnet assembly having a plurality of magnetic coils having windings of electrically conductive material, the magnetic coils being arranged in quadrants separated symmetrically about two mutually perpendicular planes, including a midplane and a plane of reflection, sets of coils also being symmetrical about a third plane that is perpendicular to both the midplane and the plane of reflection, such that the three planes are mutually orthogonal, and each of the coils being wound around an axis that is perpendicular to the midplane; the method comprising:
   cooling the magnet assembly to a temperature at which superconductivity is possible; and
   flowing current in the magnetic coils such that current flow in said coils is symmetrical about the plane of reflection and anti-symmetrical about the midplane.

* * * * *